US 6,663,418 B2

(12) United States Patent
Rees

(10) Patent No.: US 6,663,418 B2
(45) Date of Patent: Dec. 16, 2003

(54) HOLDING DEVICE FOR AN ELECTRONIC COMPONENT

(75) Inventor: Jochen Rees, Waldshut (DE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 10/162,629

(22) Filed: Jun. 6, 2002

(65) Prior Publication Data

US 2003/0003797 A1 Jan. 2, 2003

(30) Foreign Application Priority Data

Jun. 13, 2001 (EP) .............................. 01810570

(51) Int. Cl.[7] .................................................. H01R 3/00
(52) U.S. Cl. ...................................... 439/500; 361/807
(58) Field of Search ............................ 439/500, 894; 361/807, 808, 809, 811

(56) References Cited

U.S. PATENT DOCUMENTS 4,303,296 A * 12/1981 Spaulding ................... 439/189
4,516,848 A * 5/1985 Moriya ....................... 399/100
6,300,564 B1 * 10/2001 Moraes et al. ............. 174/52.1

FOREIGN PATENT DOCUMENTS

| EP | 0948003 A1 | | 10/1999 |
| FR | 2770739 | | 5/1999 |
| GB | 826457 | | 1/1960 |
| WO | WO 00/16351 | * | 3/2000 |
| WO | WO01/01549 | | 1/2001 |

* cited by examiner

Primary Examiner—Tulsidas Patel
(74) Attorney, Agent, or Firm—Burns, Doane, Swecker & Mathis, L.L.P.

(57) ABSTRACT

A holding device for at least one electronic component (1) which is made up of a first plate-shaped leg (2) and a second plate-shaped leg (3) is specified, the two legs (2; 3) being connected to each other at one of their leg ends and forming in relation to each other a substantially orthogonal angle, the first leg (2) and the second leg (3) in each case having a leg inner wall (4; 5) facing the substantially orthogonal angle, the leg inner wall (4) of the first leg (2) having a receiving surface (6) for the resting of a lateral surface part of the electronic component (1) and the leg inner wall (5) of the second leg (3) having at least one pressing surface (7) for the surface-area contacting of a surface part of the component (1) comprising an electrical terminal.

15 Claims, 4 Drawing Sheets

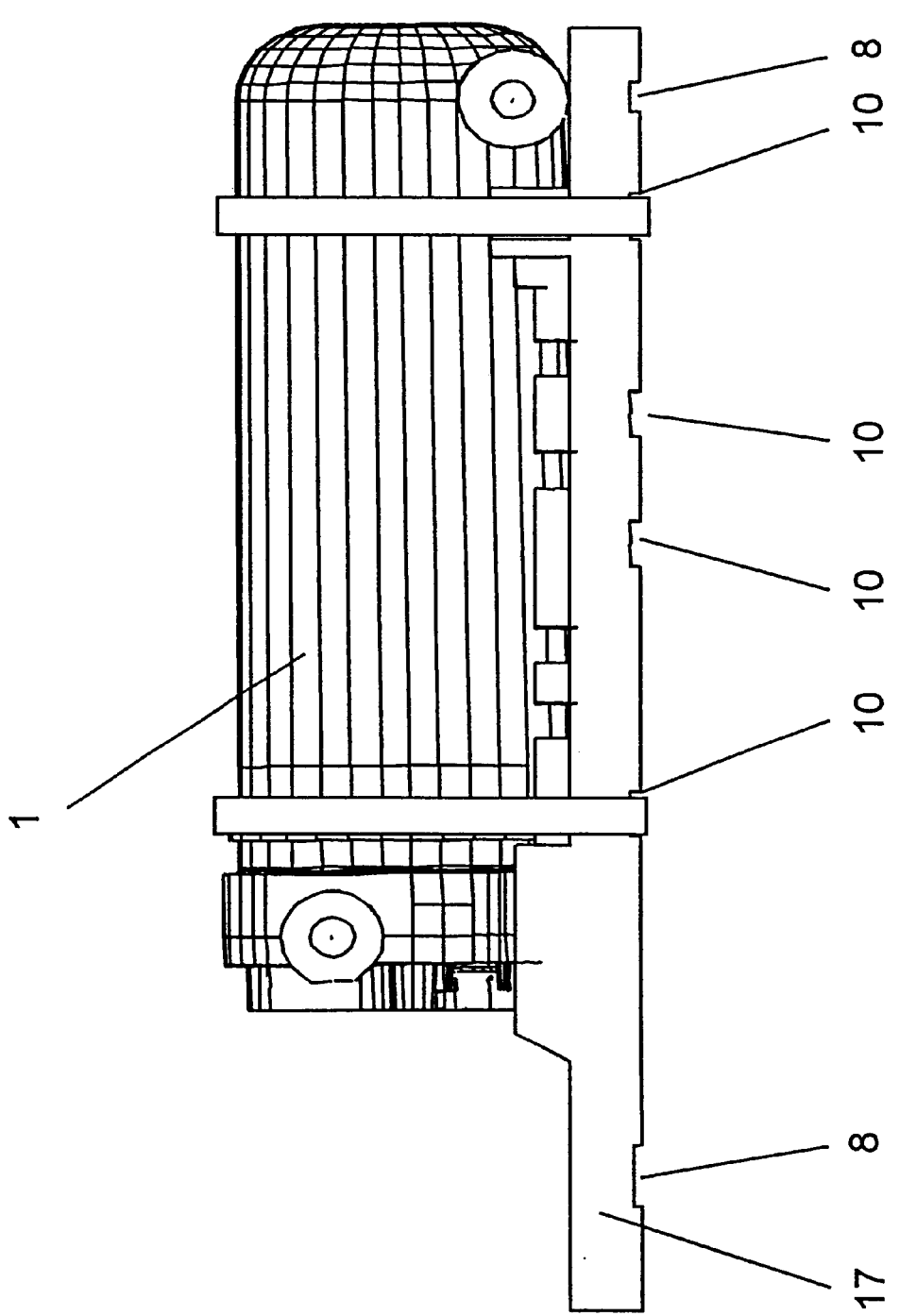

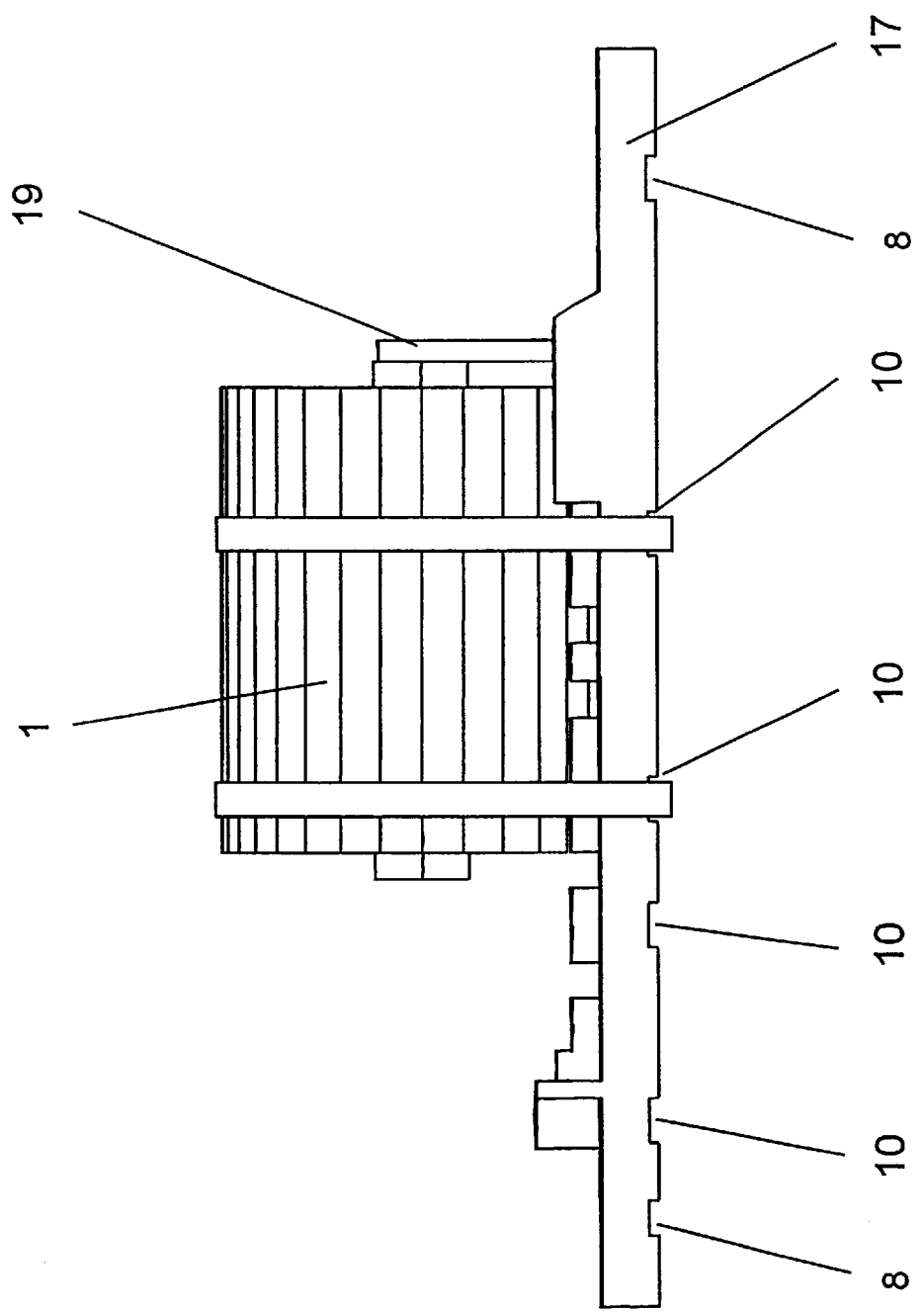

HOLDING DEVICE FOR AN ELECTRONIC COMPONENT

This application claims priority under 35 U.S.C. §§119 and/or 365 to application Ser. No. 01810570.0 filed in Europe on Jun. 13, 2001; the entire content of which is hereby incorporated by reference.

FIELD OF THE INVENTION

The present invention relates to the field of fastening techniques for electronic components. It concerns a holding device for at least one electronic component according to the precharacterizing clause of the independent claim.

BACKGROUND OF THE INVENTION

Electronic components, in particular power resistors or power capacitors, are today used in a wide range of power electronic circuits, in particular in power converter circuits. For fastening the corresponding electronic component in the power converter circuit, customary holding devices are provided. Such a holding device is made up of two plate-shaped legs, which are connected to each other at one of their leg ends. The two legs thereby substantially form an orthogonal angle. The component is customarily fastened to one of the legs at its electrical terminals. The other leg serves for the fastening of the holding device, for example to a frame of a power converter circuit, and is provided for this purpose with corresponding holes.

It is problematical in the case of such a holding device that the electronic component is connected to the holding device only at its electrical terminals. Under mechanical loads, in particular bending loads on the component, as can customarily occur in the tough conditions in which a power converter circuit operates, the terminals of the component may break off and consequently damage or destroy the component and the holding device. Furthermore, when a holding device is already mounted in a power converter circuit, mounting of the component for exchange and maintenance purposes is very difficult, since the component can only be fastened to the holding device at its terminals and otherwise has no further holding point and/or no additional holding surface which could assume a holding function for the component during mounting and maintenance. As a result, however, mounting and maintenance of the component is complex, laborious and causes considerable costs.

SUMMARY OF THE INVENTION

It is therefore an object of the invention to develop a holding device for at least one electronic component in such a way that improved fastening of the component in a circuit, in particular a power converter circuit, is achieved and particularly easy, quick and consequently low-cost mounting and maintenance of the component are made possible. This object is achieved by the features of claim 1. Advantageous developments of the invention are specified in the subclaims.

The holding device according to the invention for at least one electronic component is made up of a first substantially plate-shaped leg and a second substantially plate-shaped leg, the two legs being connected to each other at one of their leg ends and forming in relation to each other a substantially orthogonal angle. According to the invention, the first leg and the second leg in each case have a leg inner wall facing the substantially orthogonal angle, the leg inner wall of the first leg having a receiving surface for the resting of a lateral surface part of the electronic component. This receiving surface advantageously provides a holding point, a holding line or a holding surface, on which the component can rest and consequently be given an additional hold in addition to the customary fastening of the component to one of the legs, in particular to the second leg, at its electrical terminals. Altogether, the receiving surface gives the component improved fixing, for example in a power converter circuit. Furthermore, for mounting and/or maintenance purposes, the component merely has to be placed onto the receiving surface and can then finally be fastened very easily and quickly at its electrical terminals, so that low-cost maintenance and/or mounting can be achieved.

In addition, the leg inner wall of the second leg has, according to the invention, at least one pressing surface for the surface-area contacting of a surface part of the component comprising an electrical terminal. Under mechanical loading of the component, which is customarily fastened to the second leg by its electrical terminals, the component is pressed with the surface part against the pressing surface by the terminal fastening and is consequently additionally fixed, since there is almost no play between the pressing surface and the surface part of the component with the electrical terminals, so that the electrical terminals can be advantageously relieved. The service life of the component and of the holding device can advantageously be increased, since the holding device and the component are less frequently damaged or even destroyed by tearing off of the electrical terminals.

These and further objects, advantages and features of the present invention are evident from the detailed description below of preferred exemplary embodiments of the invention in conjunction with the drawing.

BRIEF DESCRIPTION OF THE DRAWINGS

In the drawing:

FIG. 2b shows a front view of the second embodiment of the holding device according to FIG. 2a.

Figure 1A:
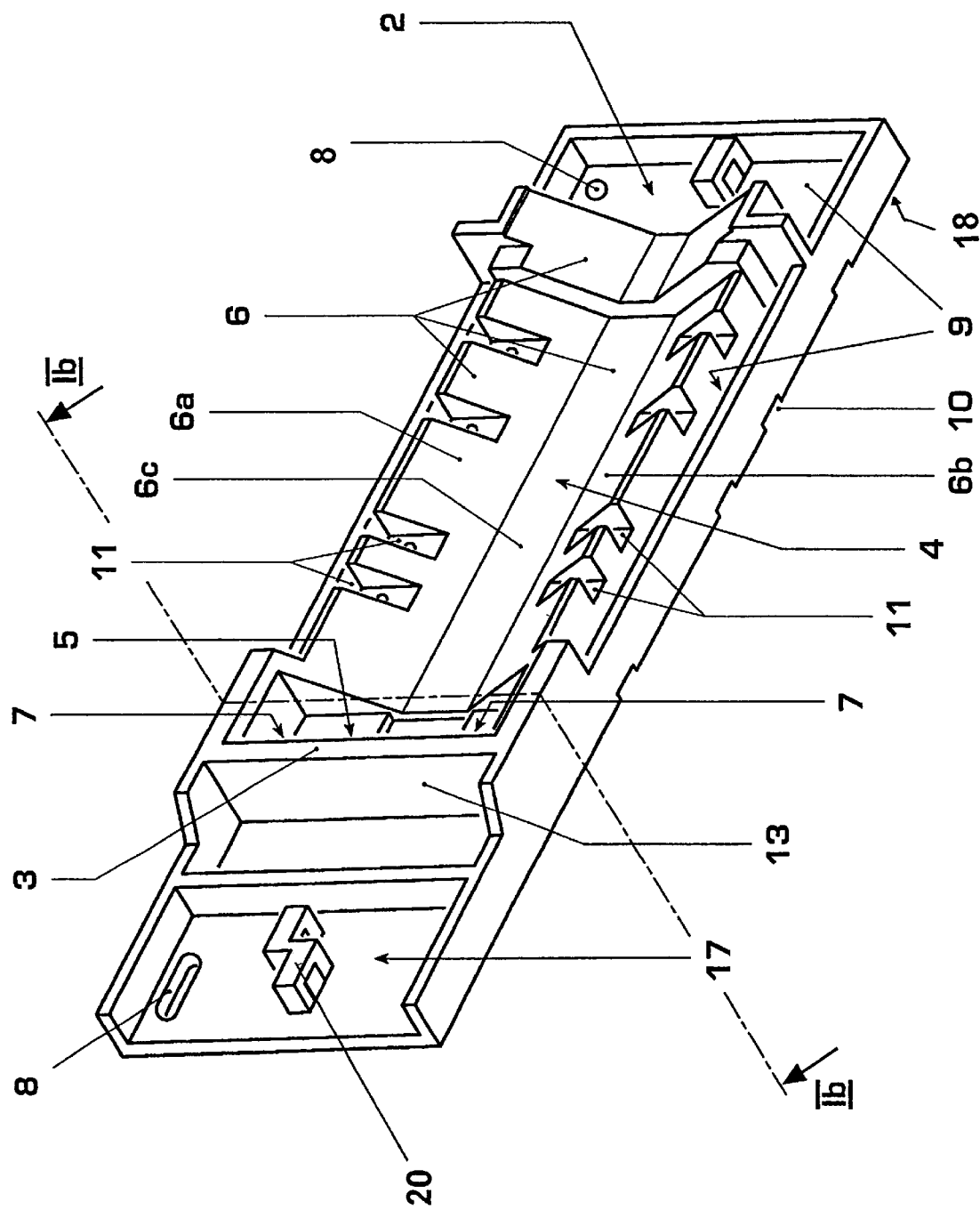
FIG. 1a shows a spatial representation of a first embodiment of a holding device according to the invention for at least one electrical component.

The reference numerals used in the drawing and their meaning are listed in a summarized form in the list of designations. In principle, the same parts are provided with the same reference numerals in the figures. The embodiments described are given by way of example for the subject matter of the invention and have no restrictive effect.

DETAILED DESCRIPTION OF THE INVENTION

In FIG. 1a, a spatial representation of a first embodiment of a holding device according to the invention for at least one electrical component 1, in particular for a power resistor or power capacitor, is represented. For the sake of overall clarity, the electronic component 1 is not shown in FIG. 1a. According to FIG. 1a, the holding device according to the invention is made up of a first leg 2 and a second leg 3. The first leg 2 and the second leg 3 are designed substantially in a plate-shaped form, the two legs 2, 3 being connected to each other at one of their leg ends. In this case, the two legs 2, 3 are arranged in such a way that they form in relation to each other a substantially orthogonal angle.

According to the invention, the first leg 2 and the second leg 3 have in each case a leg inner wall 4, 5 facing the substantially orthogonal angle, the leg inner wall 4 of the first leg 2 having a receiving surface 6 for the resting of a lateral surface part of the electronic component 1. The receiving surface 6 advantageously represents a holding point or a holding surface for the electronic component 1, on which the component 1 can rest. The receiving surface 6 thus offers the component 1 an additional hold in addition to the customary fastening, known from the prior art, of the component to one of the legs 2, 3, in particular to the second leg 3, at its electrical terminals.

Figure 1B:
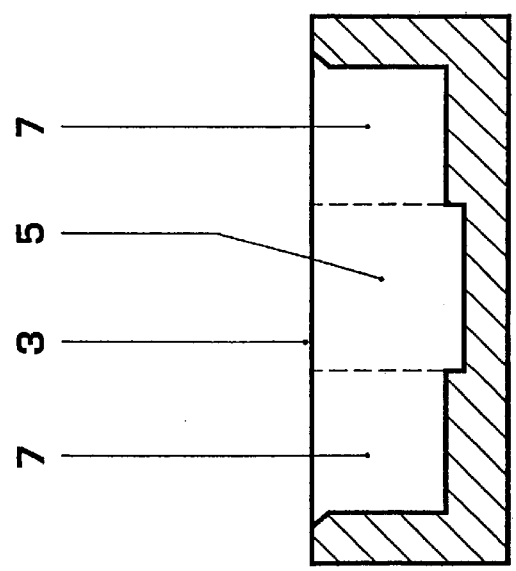
FIG. 1b shows a sectional representation along Ib—Ib of the first embodiment of the holding device according to FIG. 1a, FIG. 1c shows a front view of the first embodiment of the holding device according to FIG. 1a, FIG. 2a shows a spatial representation of a detail of a second embodiment of the holding device according to the invention for at least one electrical component

In FIG. 1b, a sectional representation along Ib—Ib of the first embodiment of the holding device according to FIG. 1a is shown. According to the invention, the second leg 3 according to FIG. 1a and FIG. 1b has on its leg inner wall 5 at least one pressing surface 7 for the surface-area contacting of a surface part of the component 1 comprising an electrical terminal. The component 1 is pressed with the surface part against the pressing surface 7 by the fastening at its electrical terminals to the second leg 2, so that the component 1 can be additionally fixed under mechanical loads, since there is almost no play between the pressing surface 7 and the surface part of the component with the electrical terminals. The electrical terminals of the component 1 are advantageously relieved, whereby the service life of the component 1 and of the holding device can be increased, since the holding device and the component 1 are less frequently damaged or even destroyed by tearing off of the electrical terminals.

In FIG. 1c, a front view of the first embodiment of the holding device according to FIG. 1a is represented, a power resistor being additionally shown in FIG. 1c by way of example for the electronic component 1. According to FIG. 1a, the leg inner wall 4 of the first leg 2 has an edge region 9, the receiving surface 6 extending up to the edge region 9. Accordingly, the edge region 9 extends from the receiving surface 9 up to the edge of the first leg 2. Provided in this edge region 9, perpendicularly to the leg inner wall 4 of the first leg 2, are at least two mounting holes 8, which in each case run from the leg inner wall 4 of the first leg 2 to a leg outer wall 18 of the first leg 2, lying opposite the leg inner wall 4. It is possible by means of these mounting holes 8 to mount the holding device very easily on a frame, for example of a power converter circuit. Also provided in the edge region 9, perpendicularly to the leg inner wall 4 of the first leg 2, are at least two holes 10, which in each case run from the leg inner wall 4 of the first leg 2 to a leg outer wall 18 of the first leg 2, lying opposite the leg inner wall 4. Lashing straps according to FIG. 1c, in particular cable ties, can be looped through the holes 10, being placed around the component and pressing the latter against the receiving surface 6 by being pulled tight and subsequently secured. A further improvement of the mounting of the holding device on a frame of a power converter circuit can be achieved by a continuation plate 17, extending in line in the opposite direction with respect to the first leg 2, being arranged at the joint of the first leg 2 with the second leg 3, at least one further mounting hole 8, running perpendicularly through the continuation plate 17, being provided, at which hole the holding device can be additionally fastened.

Furthermore, according to the invention, the receiving surface 6 according to FIG. 1a has a first surface part 6a and a second surface part 6b, the two surface parts 6a, 6b extending in each case substantially in a surface-part running direction X. In this case, the surface-part running direction X is defined as the direction which points from the joint of the first leg 2 with the second leg 3 up to the in-line opposite leg end of the first leg 2, as depicted in FIG. 1a. In a perpendicular direction with respect to the surface-part running direction X, the first surface part 6a and the second surface part 6b according to FIG. 1a rise in a roof-like manner toward the edge region 9, the two surface parts 6a, 6b lying opposite each other. This has the advantageous effect that cylindrical components 1 with a substantially circular cross section, as represented in FIG. 1c, are given a 1 larger holding surface, so that the holding function of the receiving surface 6 can be improved. A further enlargement of the holding surface can be advantageously achieved by the receiving surface 6 according to FIG. 1a having a third surface part 6c, which extends substantially in the surface-part running direction X defined above between the first surface part 6a and the second surface part 6b.

In addition, the first surface part 6a and the second surface part 6b of the receiving surface 6 as shown in FIG. 1a have according to the invention grooves 11 running perpendicularly to the surface-part running direction X. Opposite and in line with a groove 11 of the first surface part 6a there respectively lies a groove 11 of the second surface part 6b. In the respectively opposite grooves 11, spacing elements, not shown in FIG. 1a for the sake of overall clarity, can be inserted according to the size of the component 1, making it impossible for the component 1 to slip in the surface-part running direction X and at the same time ensuring that the component 1 is pressed further against the pressing surface 7.

Figure 2A:
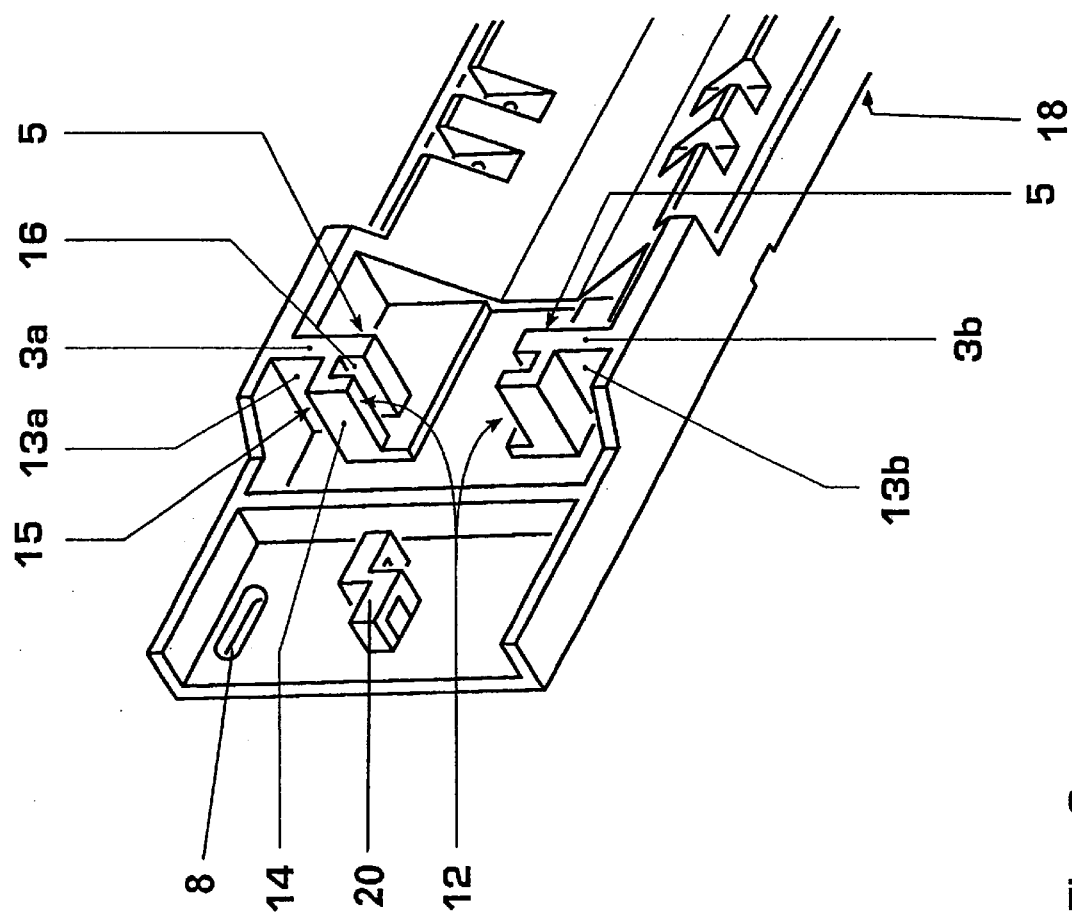

Represented in FIG. 2a is a spatial representation of a detail of a second embodiment of the holding device according to the invention for at least one electrical component 1, which differs from the first embodiment according to the invention described above and according to FIG. 1a, FIG. 1b and FIG. 1c in that the second leg 3 has a clearance 12 extending substantially from the joint of the first leg 2 with the second leg 3 to the in-line opposite leg end of the second leg 3. The clearance 12 is formed as a lead-through from the leg inner wall 5 of the second leg 3 to a leg outer wall 13 of the second leg 3, lying opposite the leg inner wall 5, and divides the second leg 3 according to FIG. 2a into two part-legs 3a, 3b. Connection cables at the electrical terminals of the component, which are not represented for the sake of overall clarity, can in this way be led away from the holding device through the clearance 12 very easily and over a short path, so that advantageously little connection cable material is required. The first embodiment of the holding device according to the invention as shown in FIG. 1a and the second embodiment of the holding device according to the invention as shown in FIG. 2a have a connection-cable fastening device 20, which is provided on the side of the continuation plate 17 facing the second leg 3. The connection-cable fastening device 20 is advantageously designed in the form of a butt strap, so that the connection cables can be secured on the connection-cable fastening device 20 with lashing straps, in particular cable ties, which are looped through the connection-cable fastening device 20. The electrical terminals of the component can consequently be advantageously protected against mechanical effects by the connection cables.

Since the second leg 3 is divided into two part-legs 3a, 3b in the way described above, the leg inner wall 5 and the leg outer wall 13 of the second leg 3 are correspondingly divided into in each case a leg inner wall of the associated part-leg 3a, 3b and a leg outer wall 13a, 13b of the associated part-leg 3a, 3b. Furthermore, an element 14 designed in the form of an angle is provided on the leg outer wall 13a, 13b of each part-leg 3a, 3b according to FIG. 2a. The angle-shaped element 14 forms with part of the leg outer wall 13a, 13b of the associated part-leg 3a, 3b a receiving device 15 for a component holding rail 19. Such a component holding rail 19 is represented in FIG. 2b in a front view of the second embodiment of the holding device according to FIG. 2a, a power capacitor with a circular cross section and in each case an electrical terminal on each end face being additionally shown in FIG. 2b by way of example of the electronic component 1. The receiving device 15 has, according to FIG. 2a, a depression 16 running along the leg outer wall 13a, 13b of the associated part-leg 3a, 3b up to the joint of the first leg 2 with the respective part-leg 3a, 3b. The depression 16 is preferably open toward the clearance 12, so that the component holding rail 19 is insertable into the respective depression and manages without any further fastening. According to FIG. 2b, the power capacitor is pressed against the receiving surface 6 by cable ties looped through the holes 10 and placed around the power capacitor and secured. The power capacitor is connected with one of its electrical terminals to the component holding rail 19 and consequently is advantageously given additional hold. The holding device according to the invention may advantageously receive a plurality of electronic components 1, in particular power capacitors, the electronic components resting in series on the receiving surface and preferably being pressed in each case by lashing straps, in particular cable ties, against the receiving surface 6 in the way described above.

The holding device according to the invention is advantageously made up of a castable insulating material, whereby the two legs 2, 3 and the further components, described above, of the holding device can be realized without any problem, without any machining, such as in particular milling and/or grinding, being necessary.

Altogether, improved fastening of the electronic component 1 in a circuit, in particular a power converter circuit, can be achieved with the holding device according to the invention, it additionally being possible to accomplish particularly easy, quick and consequently low-cost mounting and maintenance of the component 1.

LIST OF DESIGNATIONS 1 electronic component
2 first leg
3 second leg
3a, 3b part-leg
4 leg inner wall of the first leg
5 leg inner wall of the second leg
6 receiving surface
6a first surface part
6b second surface part
6c third surface part
7 pressing surface
8 mounting hole
9 edge region
10 holes
11 groove
12 clearance
13 leg outer wall of the second leg
13a, 13b leg outer wall of the part-leg
14 element
15 receiving device
16 depression
17 continuation plate
18 leg outer wall of the first leg
19 component holding rail
20 connection-cable fastening device

I claim:

1. A holding device for at least one electronic component comprising an end having an electrical terminal, the holding device being made up of a first substantially plate-shaped leg and a second substantially plate-shaped leg, the two legs being connected to each other at one of their leg ends and forming in relation to each other a substantially orthogonal angle, wherein each of the first leg and the second leg have a leg inner wall facing the substantially orthogonal angle, wherein the leg inner wall of the first leg has a receiving surface for the resting of a lateral surface part of the electronic component, and wherein the leg inner wall of the second leg has at least one pressing surface adapted to receive and contact the end of the electronic component having the electrical terminal.

2. The holding device as claimed in claim 1, wherein a continuation plate, extending in line in the opposite direction with respect to the first leg is arranged at the joint of the first leg with the second leg, at least one mounting hole, running perpendicularly through the continuation plate, being provided.

3. The holding device as claimed in claim 2, wherein a connection-cable fastening device is provided on the side of the continuation plate facing the second leg.

4. The holding device as claimed in claim 1, wherein the leg inner wall of the first leg has an edge region and wherein the receiving surface extends up to the edge region.

5. The holding device as claimed in claim 4, wherein provided in the edge region, perpendicularly to the leg inner wall of the first leg, are at least two holes, and each of the holes run from the leg inner wall of the first leg to a leg outer wall of the first leg.

6. The holding device as claimed in claim 4, wherein provided in the edge region, perpendicularly to the leg inner wall of the first leg, are at least two mounting holes, and each of the holes run from the leg inner wall of the first leg to a leg outer wall of the first leg.

7. The holding device as claimed in claim 4, wherein the receiving surface has a first surface part and a second surface part, and wherein each of the two surface parts extend substantially in a surface-part running direction, the surface-part running direction being defined as the direction which points from the joint of the first leg with the second leg to the in-line opposite leg end of the first leg.

8. The holding device as claimed in claim 7, wherein the first surface part and the second surface part rise in a roof-like manner toward the edge region, perpendicularly to the surface-part running direction.

9. A holding device for at least one electronic component, the holding device being made up of a first substantially plate-shaped leg and a second substantially plate-shaped leg, the two legs being connected to each other at one of their leg ends and forming in relation to each other a substantially orthogonal angle, wherein each of the first leg and the second leg have a leg inner wall facing the substantially orthogonal angle, wherein the leg inner wall of the first leg has a receiving surface for the resting of a lateral surface part of the electronic component, wherein the leg inner wall of the second leg has at least one pressing surface for the surface-area contacting of a surface part of the component comprising an electrical terminal, wherein the leg inner wall of the first leg has an edge region and wherein the receiving surface extends up to the edge region, wherein the receiving surface has a first surface part and a second surface part, and wherein the first and second surface parts each extend substantially in a surface-part running direction, the surface-part running direction being defined as the direction which points from the joint of the first leg with the second leg to the in-line opposite leg end of the first leg, wherein the first surface part and the second surface part have grooves running perpendicularly to the surface-part running direction.

10. The holding device as claimed in claim 9, wherein opposite and in line with a groove of the first surface part there respectively lies a groove of the second surface part.

11. The holding device as claimed in claim 7, wherein the receiving surface has a third surface part, which extends substantially in the surface-part running direction between the first surface part and the second surface part.

12. The holding device as claimed in claim 1, wherein the second leg has a clearance extending substantially from the joint of the first leg with the second leg to the in-line opposite leg end of the second leg.

13. The holding device as claimed in claim 12, wherein the clearance is formed as a lead-through from the leg inner wall of the second leg to a leg outer wall of the second leg and divides the second leg into two part-legs.

14. A holding device for at least one electronic component, the holding device being made up of a first substantially plate-shaped leg and a second substantially plate-shaped leg, the two legs being connected to each other at one of their leg ends and forming in relation to each other a substantially orthogonal angle, wherein each of the first leg and the second leg have a leg inner wall facing the substantially orthogonal angle, wherein the leg inner wall of the first leg has a receiving surface for the resting of a lateral surface part of the electronic component, wherein the leg inner wall of the second leg has at least one pressing surface for the surface-area contacting of a surface part of the component comprising an electrical terminal, wherein the second leg has a clearance extending substantially from the joint of the first leg with the second leg to the in-line opposite leg end of the second leg, wherein the clearance is formed as a lead-through from the leg inner wall of the second leg to a leg outer wall of the second leg and divides the second leg into two part-legs, wherein an element which forms with part of the leg outer wall of the associated part-leg a receiving device for a component holding rail is provided on a leg outer wall of each part-leg.

15. The holding device as claimed in claim 14, wherein the receiving device has a depression running along the leg outer wall of the associated part-leg up to the joint of the first leg with the respective part-leg, the depression being open toward the clearance.

* * * * *